(12) United States Patent
Azdasht

(10) Patent No.: US 8,480,298 B2
(45) Date of Patent: Jul. 9, 2013

(54) DEVICE FOR POSITIONING AND CONTACTING TEST CONTACTS

(75) Inventor: Ghassem Azdasht, Berlin (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 115 days.

(21) Appl. No.: 13/123,566

(22) PCT Filed: Oct. 5, 2009

(86) PCT No.: PCT/DE2009/001374
§ 371 (c)(1),
(2), (4) Date: Apr. 11, 2011

(87) PCT Pub. No.: WO2010/043196
PCT Pub. Date: Apr. 22, 2010

(65) Prior Publication Data
US 2011/0235681 A1    Sep. 29, 2011

(30) Foreign Application Priority Data
Oct. 17, 2008    (DE) .......................... 10 2008 051 853

(51) Int. Cl.
*G01K 1/08*    (2006.01)
*G01K 1/00*    (2006.01)

(52) U.S. Cl.
USPC ............................................ 374/141; 374/208

(58) Field of Classification Search
None
See application file for complete search history.

(56) References Cited

U.S. PATENT DOCUMENTS

| 4,534,811 | A | | 8/1985 | Ainslie et al. |
|---|---|---|---|---|
| 4,778,097 | A | * | 10/1988 | Hauser .......................... 228/44.7 |
| 4,970,365 | A | * | 11/1990 | Chalco ...................... 219/121.63 |
| 2001/0009376 | A1 | | 7/2001 | Takekoshi et al. |
| 2006/0065642 | A1 | | 3/2006 | Shindo et al. |
| 2007/0013390 | A1 | | 1/2007 | Kuitani et al. |
| 2008/0308536 | A1 | | 12/2008 | Theppakuttai et al. |

FOREIGN PATENT DOCUMENTS

| DE | 100 35 976 | 2/2001 |
|---|---|---|
| DE | 100 37 216 | 2/2001 |
| JP | 2006 234691 | 9/2006 |
| WO | 2007/100713 | 9/2007 |
| WO | 2008/036786 | 3/2008 |

OTHER PUBLICATIONS

The International Search Report as mailed on Feb. 10, 2010 for International Application No. PCT/DE2009/001374.

* cited by examiner

*Primary Examiner* — Lisa Caputo
*Assistant Examiner* — Janice M Soto
(74) *Attorney, Agent, or Firm* — Quarles & Brady LLP

(57) ABSTRACT

A device for positioning and contacting test contacts on a contact carrier for producing a test contact arrangement includes at least one contact head having at least one transmission channel for transmitting thermal energy. The contact head being equipped with a equipped with a test contact receptacle. The test contact receptacle includes a positioning device with at least two positioning faces for the positioned abutment against a test contact and the positioning of the test contact with an absorption region for absorbing the thermal energy in the channel mouth.

9 Claims, 5 Drawing Sheets

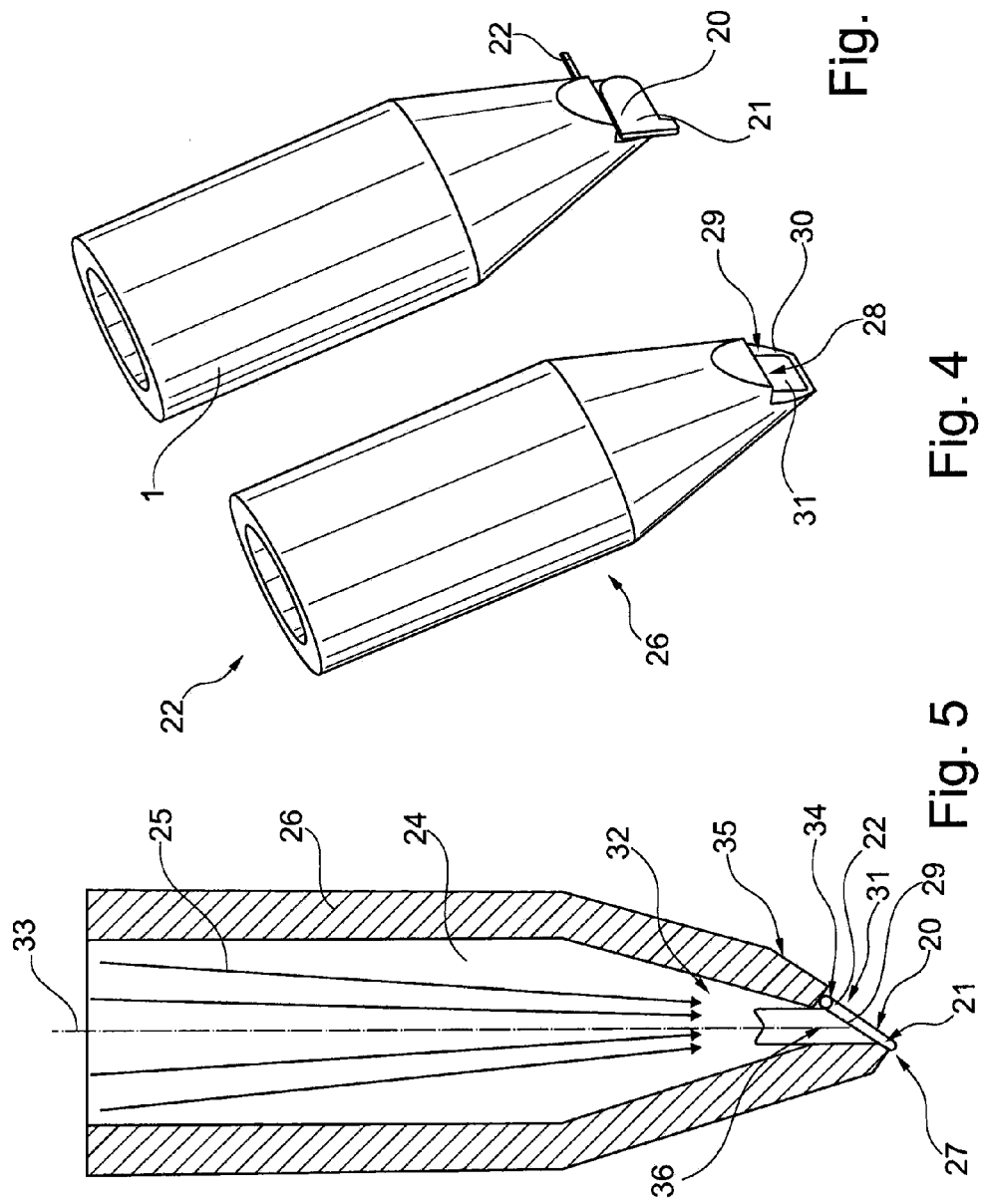

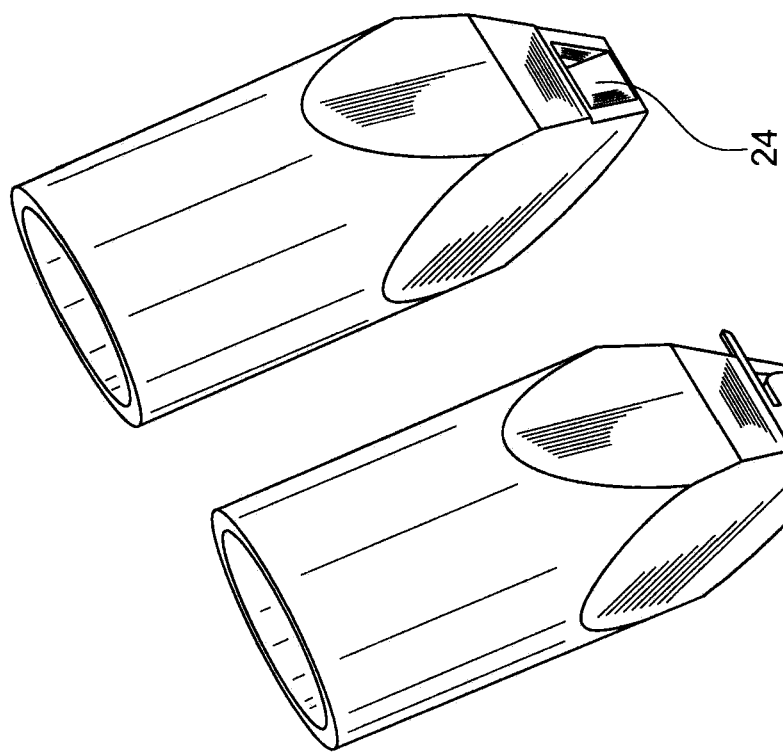
Fig. 7
Fig. 9
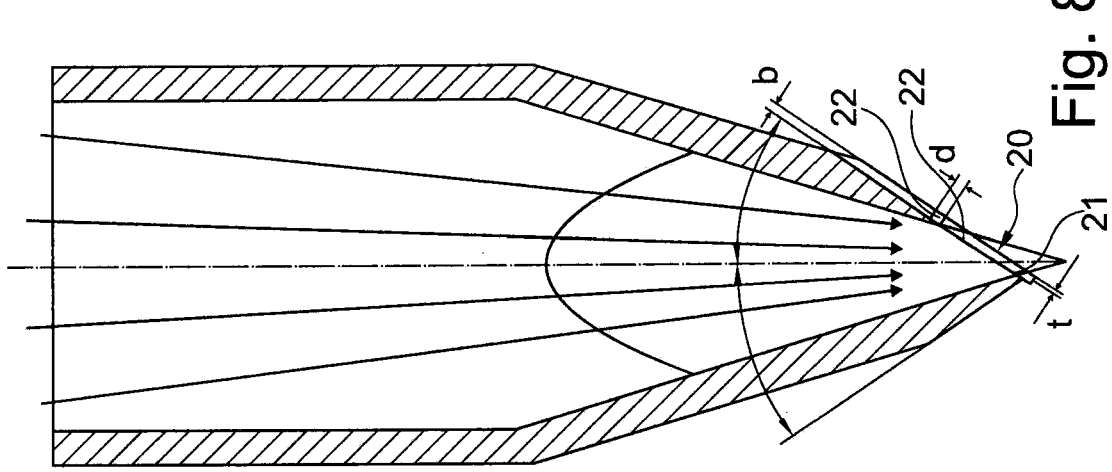
Fig. 8

DEVICE FOR POSITIONING AND CONTACTING TEST CONTACTS

CROSS REFERENCE TO RELATED APPLICATION

The present application claims the benefit of German Patent Application No. 10 2008 051 853.0 filed Oct. 17, 2008, and is a national phase of PCT International Application No. PCT/DE2009/001374 filed on Oct. 5, 2009, both applications are incorporated herein by reference.

STATEMENT REGARDING FEDERALLY SPONSORED RESEARCH OR DEVELOPMENT

Not applicable.

FIELD OF THE INVENTION

The present invention relates to a device for positioning and contacting test contacts on a contact carrier for producing a test contact arrangement, comprising at least one contact head having at least one transmission channel for transmitting thermal energy and being equipped with a test contact holding device, said contact head on the contact end thereof and in the region of a channel mouth being equipped with a test contact receptacle, wherein said test contact receptacle comprises a positioning device with at least two positioning faces for the positioned abutment against a test contact and the positioning of the test contact with an absorption region for absorbing the thermal energy in the channel mouth.

BACKGROUND OF THE INVENTION

Test contact arrangements having a plurality of test contacts are disposed on a common test platform which is equipped with a control device for controlling the individual test contacts. Here, the test contacts are disposed in a matrix arrangement according to the chips being arranged in a wafer assembly such that a defined contacting of the individual chips is enabled at wafer level with the aid of the individual test contacts.

For producing a test contact arrangement, the individual test contacts are disposed on a contact carrier which is designed as a test board corresponding to the desired matrix arrangement of the contact tips thereof, and the test contacts are soldered to contact faces formed on the test board. Due to the large number of test contacts on each test board and the thus obtained small distance between the test contacts, particularly high demands are placed both on an electrically reliable and a positionally accurate contacting of the test contacts on the test board.

SUMMARY OF THE INVENTION

Hence, it is an object of the present invention to suggest a device for positioning and contacting test contacts on a contact carrier, which enables a positionally accurate placement and a particularly reliable contacting of the test contacts on a contact carrier.

To achieve this object, the inventive device includes at least one contact head having at least one transmission channel for transmitting thermal energy. The at least one transmission channel terminates at a channel mouth proximal a contact end. The at least one contact head includes a test contact receptacle on the contact end proximal the channel mouth, wherein the test contact receptacle includes a positioning device with a first abutment face extending from the channel mouth for the positioned abutment against a test contact and a second abutment face adjacent the first abutment face. The second abutment face positions the test contact with an absorption region for absorbing the thermal energy in the channel mouth and relative to the first abutment face.

According to the invention, the device for positioning and contacting test contacts on a contact carrier for producing a test contact arrangement features a contact head having at least one transmission channel for transmitting thermal energy and being equipped with a test contact holding device, the contact head on the contact end thereof and in the region of a channel mouth being equipped with a test contact receptacle, wherein the test contact receptacle exhibits a positioning device with at least two positioning faces for positioned abutment against a test contact and the positioning of the test contact with an absorption region for absorbing the thermal energy in the channel mouth.

Consequently, the inventive device not only enables a reliable accommodation and manipulation of the test contact in the test contact receptacle during a manipulation and positioning process, but the inventive device also enables an exact positioning of the test contact on the contact carrier with the aid of a positioning device formed in the test contact receptacle and by means of two positioning faces, while at the same time permitting a defined exposure of a selected absorption region of the test contact in the channel mouth such that the thermal energy can be discretely introduced into the test contact at a desired location, respectively into a desired region (absorption region) of the test contact in order to be able to adapt both the location where the energy is applied and the dimension of the exposure face to the amount of energy required to produce a reliable contacting and to permit a warpage-free arrangement of the test contact on the contact carrier.

According to an advantageous development of the invention, the channel mouth is formed by an outlet funnel of the transmission channel and exhibits an opening cross-section being dimensioned in accordance with the absorption cross-section of the absorption region of the test contact. By selecting a corresponding geometrical design of the channel mouth, it is possible to determine a defined surface of the test contact for the absorption region of the test contact subject to a relatively low degree of technical complexity.

If, according to a preferred embodiment, at least one positioning face of the positioning device is disposed above the opening cross-section of the channel mouth such that the absorption region of the test contact is disposed within the outlet funnel of the channel mouth, it is possible to apply thermal energy in a simple manner to a relatively large partial surface of the test contact.

It is equally particularly advantageous if the channel mouth exhibits an opening cross-section being arranged at an inclined angle with respect to the longitudinal axis of the contact head, wherein a positioning face is formed by an opening edge of the channel mouth, which limits the opening cross-section. In this way, a directed lateral exposure of a partial surface of the test contact is possible, wherein at the same time a corresponding lateral extension of the contact head with respect to the test contact is enabled upon arrangement of the test contact on the contact carrier. In particular during positioning and contacting of a test contact on a contact carrier, an inclination of the contact head relative to the test contact is enabled, thereby permitting the test contacts to be arranged on the contact carrier at a distance from each other which is smaller than the diameter of the contact head.

A particularly ideal relative arrangement of the test contact with respect to the contact head is obtained when the opening cross-section is arranged in the region of the channel mouth in such a manner that it is disposed in parallel or at an acute angle with respect to the adjacent outer wall of the contact head. In this way, on the one hand it is possible to ensure that there is no considerable lateral protrusion of the contact head beyond the test contact, which would impede the smallest possible contact distance in the direction of a sequence of test contacts already disposed on the contact carrier. On the other hand, it should still be possible to realize a sufficiently large distance between the inclined contact head and the contact carrier in order to prevent an undesired contacting between the contact head and the contact carrier.

A flat portion of the tool body's outer wall which lies adjacent to the opening cross-section contributes to achieving the maximum minimization of the distance between the test contacts on the contact carrier.

BRIEF DESCRIPTION OF THE DRAWINGS

Advantageous embodiments of the invention will be described in greater detail with reference to the drawings, wherein:

FIG. 4 illustrates a contact head of a contact device in a second embodiment;

FIG. 5 illustrates the contact head shown in FIG. 4 in a longitudinal cross-sectional view;

FIG. 6 illustrates the contact head shown in FIG. 4 having a test contact disposed in a test contact receptacle;

FIG. 7 illustrates a contact head of a contact device in another embodiment;

FIG. 8 illustrates the contact head shown in FIG. 7 in a longitudinal cross-sectional view;

FIG. 9 illustrates the contact head shown in FIG. 7 having a test contact accommodated in a test contact receptacle;

DETAILED DESCRIPTION OF THE EXAMPLE EMBODIMENTS

Figure 1:
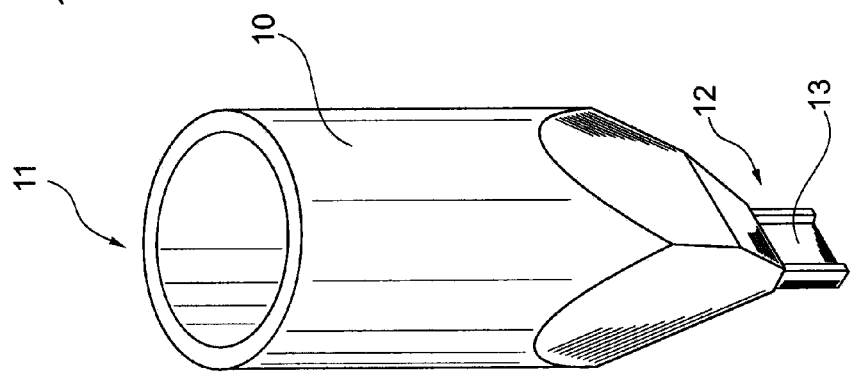
FIG. 1 illustrates a contact head of a contact device in a first embodiment.

FIG. 1 illustrates a contact head 10 of a contact device 11 having a test contact receptacle 13 formed at a contact end 12. As is apparent from the longitudinal cross-sectional view according to FIG. 2, an outlet funnel 14 is formed at the contact head 10 towards the contact end 12, which, in the transitional zone to the test contact receptacle 13, exhibits a channel mouth 39 having an opening cross-section 15. Below the opening cross-section 15 the test contact receptacle 13 extends, which in the cross-sectional view here exhibits an essentially U-shaped design and in which a test contact base abutment face 17 disposed in parallel to a longitudinal axis 16 of the contact head 10 forms a first positioning face of a positioning device 19.

Figure 3:
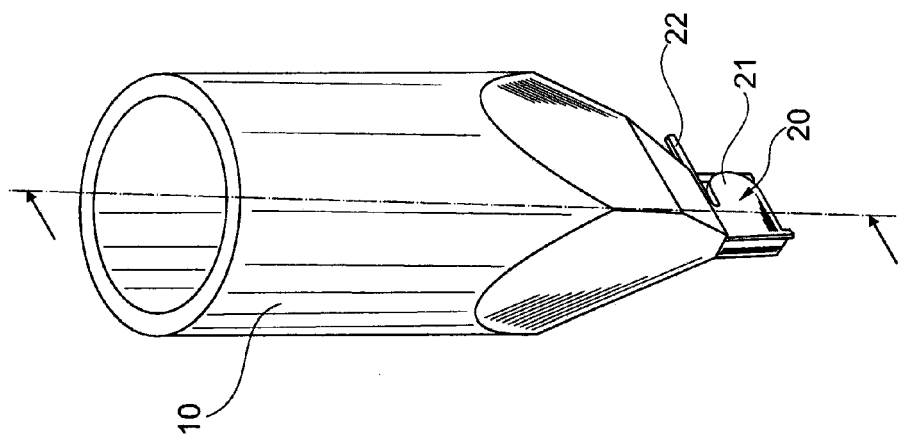
FIG. 3 illustrates the contact head shown in FIG. 1 having a test contact inserted into a test contact receptacle.
Figure 2:
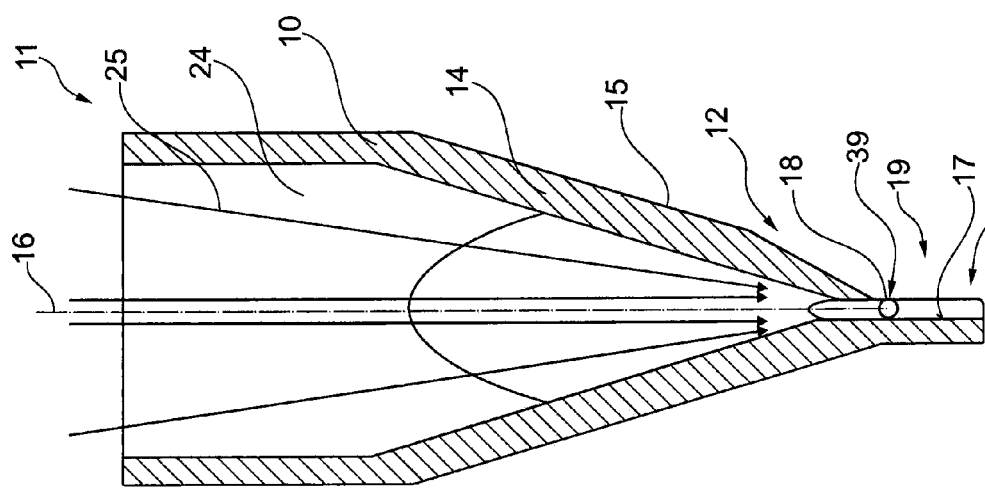
FIG. 2 illustrates the contact head shown in FIG. 1 in a longitudinal cross-sectional view.

As is evident from a combined view of FIGS. 2 and 3, the test contact receptacle 13 having the positioning device 19 formed therein enables a positioned accommodation of a test contact 20 in such a manner that the test contact 20 with a test contact base 21 laterally abuts against the test contact base abutment face 17 and with a test contact bracket 22 disposed at the test contact base 21 abuts against a test contact bracket abutment face 18 formed as a second positioning face in the region of the channel mouth 39.

As is apparent in particular from FIG. 2, by arranging the test contact 20 in the test contact receptacle 13 relative to the opening cross-section 15, an absorption region is defined as a partial surface of the test contact 20, respectively in this case of the test contact bracket 22, in which thermal energy is applied to the test contact 20 with the aid of laser radiation 25 conducted through a transmission channel 24 in the interior of the contact head 10, respectively the outlet funnel 14. In the case of the exemplary embodiment illustrated in the present case, the transmission channel 24 simultaneously serves for applying underpressure to the test contact 20, respectively to the absorption region in order to simultaneously form the contact head 10, respectively the test contact receptacle 13 as a test contact holding device.

FIG. 4 illustrates a contact head 26 which at a contact end thereof is equipped with a test contact receptacle 28, which in the region of a channel mouth 27 exhibits a test contact base abutment face 29 being formed by an opening edge 30 of an opening cross-section 31.

As is apparent from a combined view of FIGS. 5 and 6, the opening cross-section 31 of an outlet funnel 32 formed in the contact head 26 is arranged at an inclined angle α obliquely to a longitudinal axis 33 of the contact head 26. Correspondingly, the test contact base abutment face 29 is equally arranged obliquely to the longitudinal axis 33, wherein a test contact bracket abutment face 34 is formed by a lower edge of an outer wall 35 of the contact head 26. As is evident from the dash-dotted illustration of the test contact 20 in the test contact receptacle 28 in FIG. 5, the inclined arrangement of the test contact base abutment face 29 relative to the longitudinal axis 33 results in a substantially enlarged absorption region 36 of the test contact 20 compared to the exemplary embodiment of a contact head 10 illustrated in FIGS. 1 to 3, wherein here an essentially lateral application of laser radiation 25 to the test contact base 21 is performed and the test contact bracket 22 remains essentially unexposed. In this way, despite an essentially extensive application of laser radiation to the test contact base 21, which enables a sufficient amount of heat to be introduced into the test contact 20, it is possible to prevent excessive overheating of the test contact bracket 22 having a relatively thin cross-section, which would cause warpage.

As is also evident in particular from FIG. 5, the opening cross-section 31 is disposed essentially parallel to the adjacent outer wall 35 such that, compared to the exemplary embodiment of the contact head 10 illustrated in FIGS. 1 to 3, the test contact is arranged essentially flush with the outer wall 35.

FIGS. 7 to 9 in another embodiment illustrate a contact head which, in contrast to the contact head 26 illustrated in FIGS. 4 to 6, exhibits an outer wall of an outlet funnel, which in the region of a flat portion has a lower edge forming a test contact bracket abutment face and which has a width b substantially corresponding to the diameter d of the test contact bracket 22, respectively the thickness t of the test contact base 21. As is evident in particular from FIG. 9, this measure results in the test contact 20 being arranged in a test contact receptacle of the contact head, such that the test contact 20 is disposed essentially flush in the outer wall.

Figure 10:
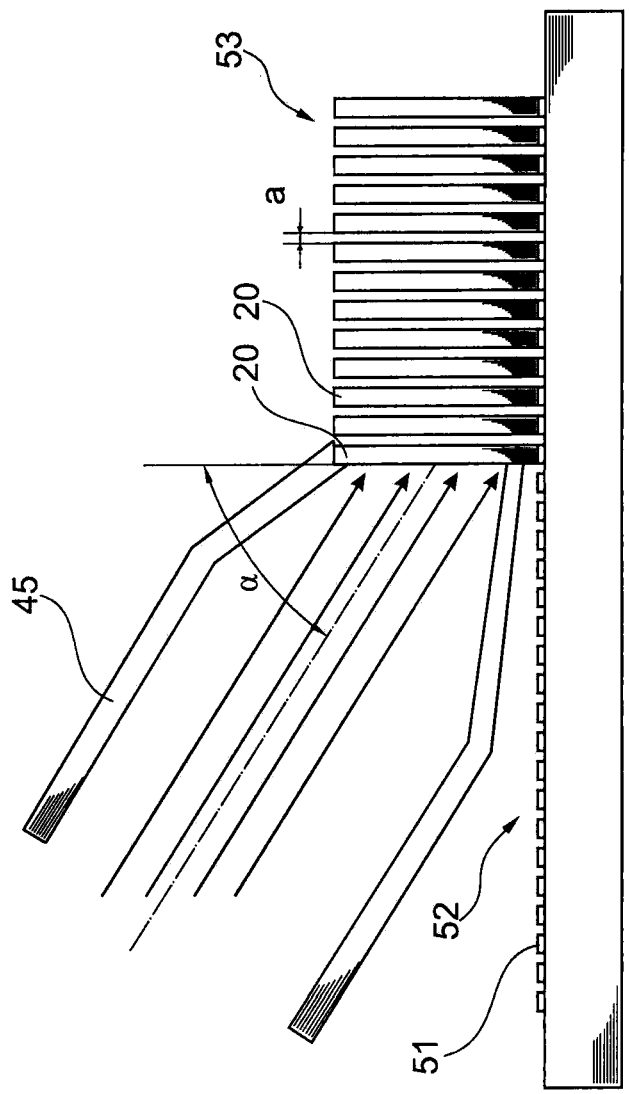
FIG. 10 illustrates a contact head during contacting of a test contact on a contact carrier.

FIG. 10 in a schematical view shows a contact head 45 during contacting of a test contact 20 on a contact face 51 disposed on a contact carrier. As is also shown in FIG. 10, the contact face 51 jointly with a plurality of further contact faces 51 forms a contact face arrangement 52 which serves for contacting, respectively arranging, a corresponding number of test contacts 20 for producing a test contact arrangement 53.

As is evident from FIG. 10, the test contact arrangement 53 is realized by sequentially contacting the test contacts 20 starting with the rightmost test contact 20 illustrated in FIG. 10. The arrangement of the test contacts 20 at an inclined angle α with respect to the longitudinal axis of the contact head results in a substantially oblique lateral arrangement of the contact head 45 with respect to the test contact 20 such that the smallest possible distances a can be realized between the individual test contacts on the contact carrier.

Figure 11:
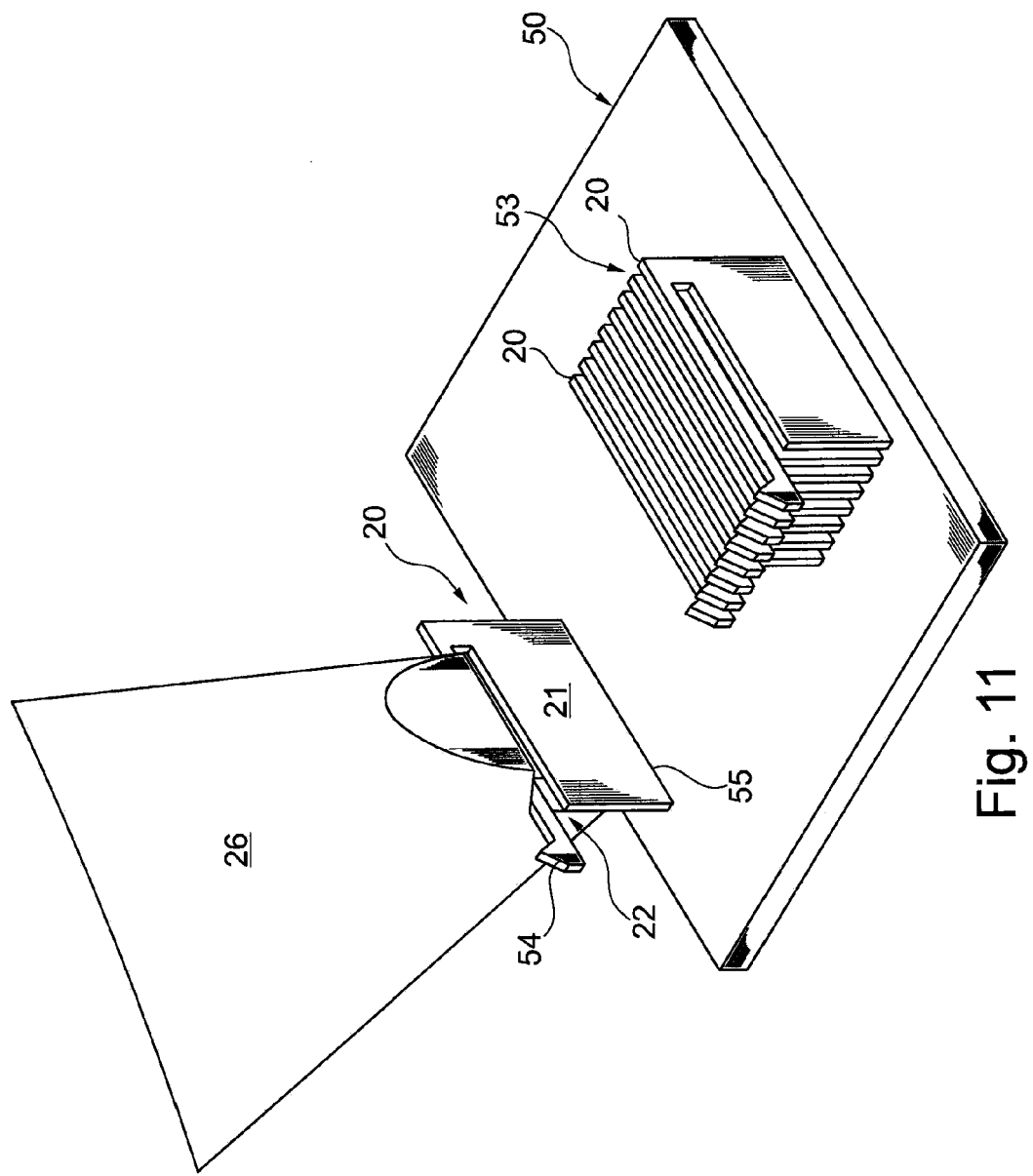
FIG. 11 shows the contact head illustrated in FIGS. 4 to 6 during contacting of a test contact on a contact carrier in a perspective view.

FIG. 11 shows the contact head 26 illustrated in FIGS. 4 to 6 during the positioning of a test contact 20 on the contact carrier 50. The test contact 20 accommodated in the test contact receptacle 28 during the positioning and subsequent contacting with the test contact bracket 22 thereof hence abuts against the test contact bracket abutment face 34. The test contact bracket 22 extends in parallel to a here essentially rectangularly formed test contact base 21 and with the test contact tip 54 thereof protrudes beyond a lower edge 55 of the test contact base 21 along which, subsequent to the positioning, contacting with the contact carrier 50 is performed.

The invention claimed is:

1. A device for positioning and contacting test contacts on a contact carrier for producing a test contact arrangement, said device comprising:
    at least one contact head having at least one transmission channel for transmitting thermal energy, said at least one transmission channel terminating at a channel mouth proximal a contact end, said at least one contact head including a test contact receptacle on the contact end proximal the channel mouth, wherein said test contact receptacle comprises a positioning device with a first abutment face extending from the channel mouth for the positioned abutment against a test contact and a second abutment face adjacent the first abutment face and positioning the test contact with an absorption region for absorbing the thermal energy in the channel mouth and relative to the first abutment face.

2. The device according to claim 1, in which the channel mouth is formed by an outlet funnel of the transmission channel and exhibits an opening cross-section which is dimensioned in accordance with an absorption cross-section of the absorption region of the test contact.

3. The device according to claim 2, in which at least one abutment face of the positioning device is disposed above the opening cross-section of the channel mouth such that the absorption region of the test contact is arranged within the outlet funnel of the channel mouth.

4. The device according to claim 1, in which the channel mouth exhibits an opening cross-section which is arranged at an inclined angle with respect to the longitudinal axis of the contact head, wherein an abutment face is formed by an opening edge of the channel mouth, which limits the opening cross-section.

5. The device according to claim 4, in which the opening cross-section is disposed in the region of the channel mouth such that it is arranged in parallel to or at an acute angle α with respect to an adjacent outer wall of the contact head.

6. The device according to claim 5, in which the outer wall of the contact head which lies adjacent to the opening cross-section exhibits a flat portion.

7. A device for positioning and contacting test contacts on a contact carrier for producing a test contact arrangement, said device comprising:
    at least one contact head having a contact end and at least one transmission channel having a channel mouth for transmitting thermal energy; and
    a test contact receptacle on the contact end and proximal the channel mouth, wherein said test contact receptacle includes a positioning device having a first abutment face extending from the channel mouth for positioned abutment against a test contact and a second abutment face adjacent the first abutment face and positioning the test contact with an absorption region for absorbing the thermal energy transmitted through the channel mouth and relative to the first abutment face.

8. The device according to claim 1, in which at least one abutment face extends downwardly from said channel mouth.

9. The device according to claim 7, in which at least one abutment face extends downwardly from said channel mouth.

* * * * *

UNITED STATES PATENT AND TRADEMARK OFFICE
CERTIFICATE OF CORRECTION

PATENT NO.       : 8,480,298 B2                                               Page 1 of 1
APPLICATION NO. : 13/123566
DATED            : July 9, 2013
INVENTOR(S)      : Ghassem Azdasht It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 114 days.

Signed and Sealed this
Eighth Day of September, 2015

Michelle K. Lee
*Director of the United States Patent and Trademark Office*